US009578789B2

(12) United States Patent
Uhlemann et al.

(10) Patent No.: US 9,578,789 B2
(45) Date of Patent: Feb. 21, 2017

(54) POWER SEMICONDUCTOR MODULE WITH LIQUID COOLING

(71) Applicant: Infineon Technologies AG, Neubiberg (DE)

(72) Inventors: Andre Uhlemann, Dortmund (DE); Thorsten Fath, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 10 days.

(21) Appl. No.: 14/282,556

(22) Filed: May 20, 2014

(65) Prior Publication Data

US 2014/0347818 A1   Nov. 27, 2014

(30) Foreign Application Priority Data

May 24, 2013   (DE) .......................... 10 2013 209 719

(51) Int. Cl.
*H05K 7/20* (2006.01)
*H01L 23/367* (2006.01)
*H02M 7/00* (2006.01)
*H01L 23/473* (2006.01)

(52) U.S. Cl.
CPC ......... *H05K 7/20927* (2013.01); *H01L 23/473* (2013.01); *H02M 7/003* (2013.01); *H01L 23/3672* (2013.01); *H01L 2924/0002* (2013.01); *Y10T 29/41* (2015.01)

(58) Field of Classification Search
CPC ...... H01L 2924/00; H01L 23/473; G06F 1/20; G06F 2200/201; H05K 7/20772; H05K 7/20781; H05K 7/2079

USPC ... 361/679.53, 689, 692, 698, 699, 702, 703
See application file for complete search history.

(56) References Cited

U.S. PATENT DOCUMENTS

| 4,765,397 A | * | 8/1988 | Chrysler | ............... H01L 23/473 |
| | | | | 165/104.33 |
| 4,949,164 A | * | 8/1990 | Ohashi | .................. H01L 23/427 |
| | | | | 165/104.33 |
| 5,309,319 A | * | 5/1994 | Messina | .............. H01L 23/4336 |
| | | | | 165/142 |

(Continued)

FOREIGN PATENT DOCUMENTS

| CN | 101490841 A | 7/2009 |
| CN | 201994284 U | 9/2011 |
| CN | 102543916 A | 7/2012 |

*Primary Examiner* — Adam B Dravininkas
(74) *Attorney, Agent, or Firm* — Murphy, Bilak & Homiller, PLLC

(57) ABSTRACT

A power semiconductor module includes a substrate and a two-part cooling system arranged under the substrate. The cooling system has upper and lower pieces. The upper piece forms a flow channel with the substrate for a cooling liquid. The upper piece has a first inflow and an outflow, through which the cooling liquid can be introduced into the flow channel and removed. The upper piece also has at least one second inflow, which is spaced apart from the first inflow in a longitudinal direction. The lower piece has an inlet and an outlet, the outlet being connected to the outflow and the inlet being connected to the first inflow. The lower piece also has a channel branching off from the inlet, which includes at least one bypass channel, which is connected to the second inflow, so part of the cooling liquid passes through the bypass channel into the flow channel.

12 Claims, 3 Drawing Sheets

(56) References Cited

U.S. PATENT DOCUMENTS

| | | | |
|---|---|---|---|
| 2005/0052848 A1* | 3/2005 | Hamman | F28D 1/0535 |
| | | | 361/701 |
| 2007/0000656 A1* | 1/2007 | Nakahama | F28F 3/12 |
| | | | 165/170 |
| 2008/0079021 A1* | 4/2008 | Bayerer | H01L 23/373 |
| | | | 257/177 |
| 2008/0298018 A1* | 12/2008 | Sasaki | H01S 5/024 |
| | | | 361/699 |
| 2009/0205802 A1* | 8/2009 | Yoshida | H01L 23/4735 |
| | | | 165/41 |
| 2011/0299244 A1* | 12/2011 | Dede | F28F 3/046 |
| | | | 361/689 |
| 2012/0212907 A1* | 8/2012 | Dede | H01L 23/4735 |
| | | | 361/702 |

* cited by examiner

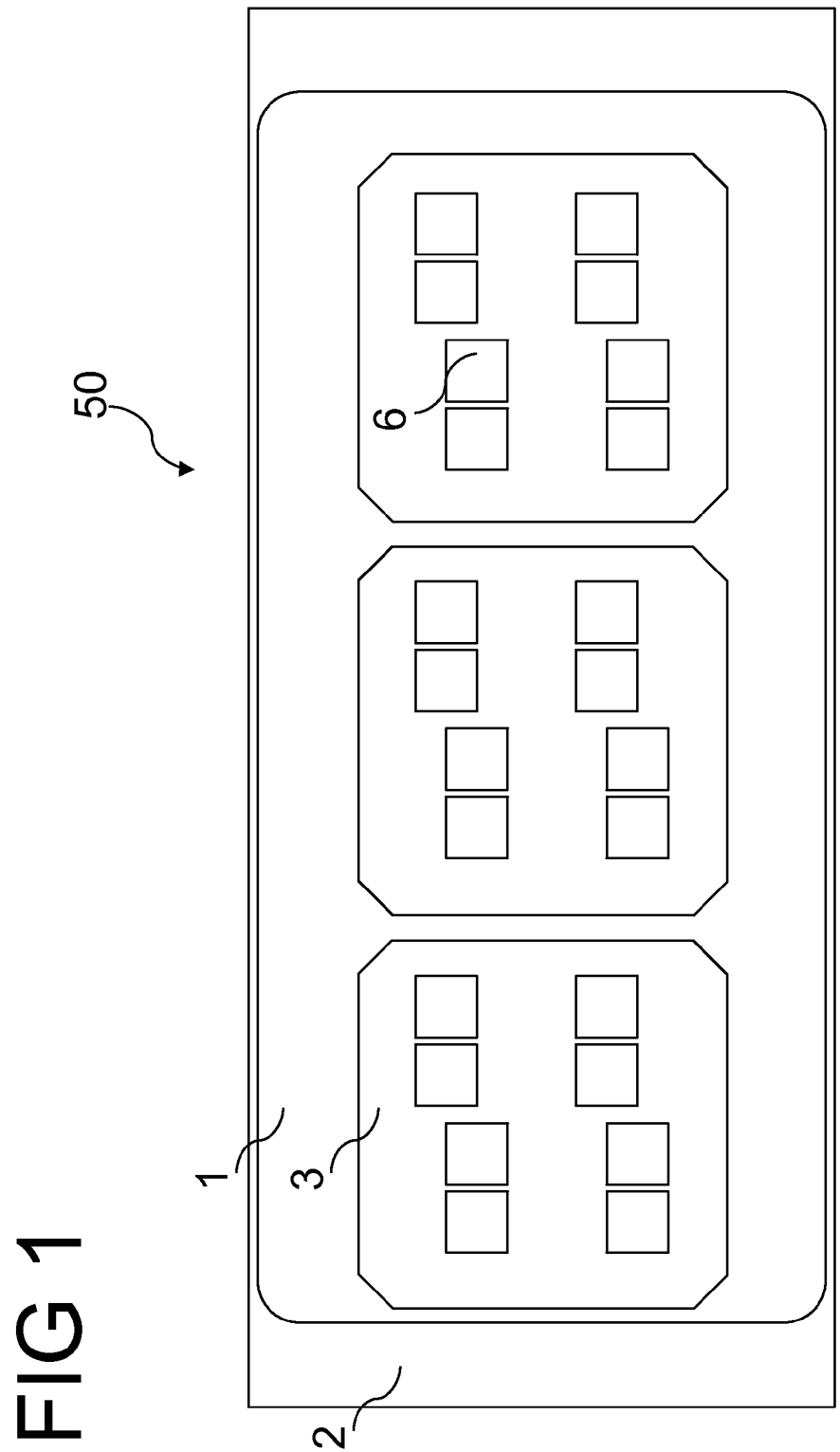

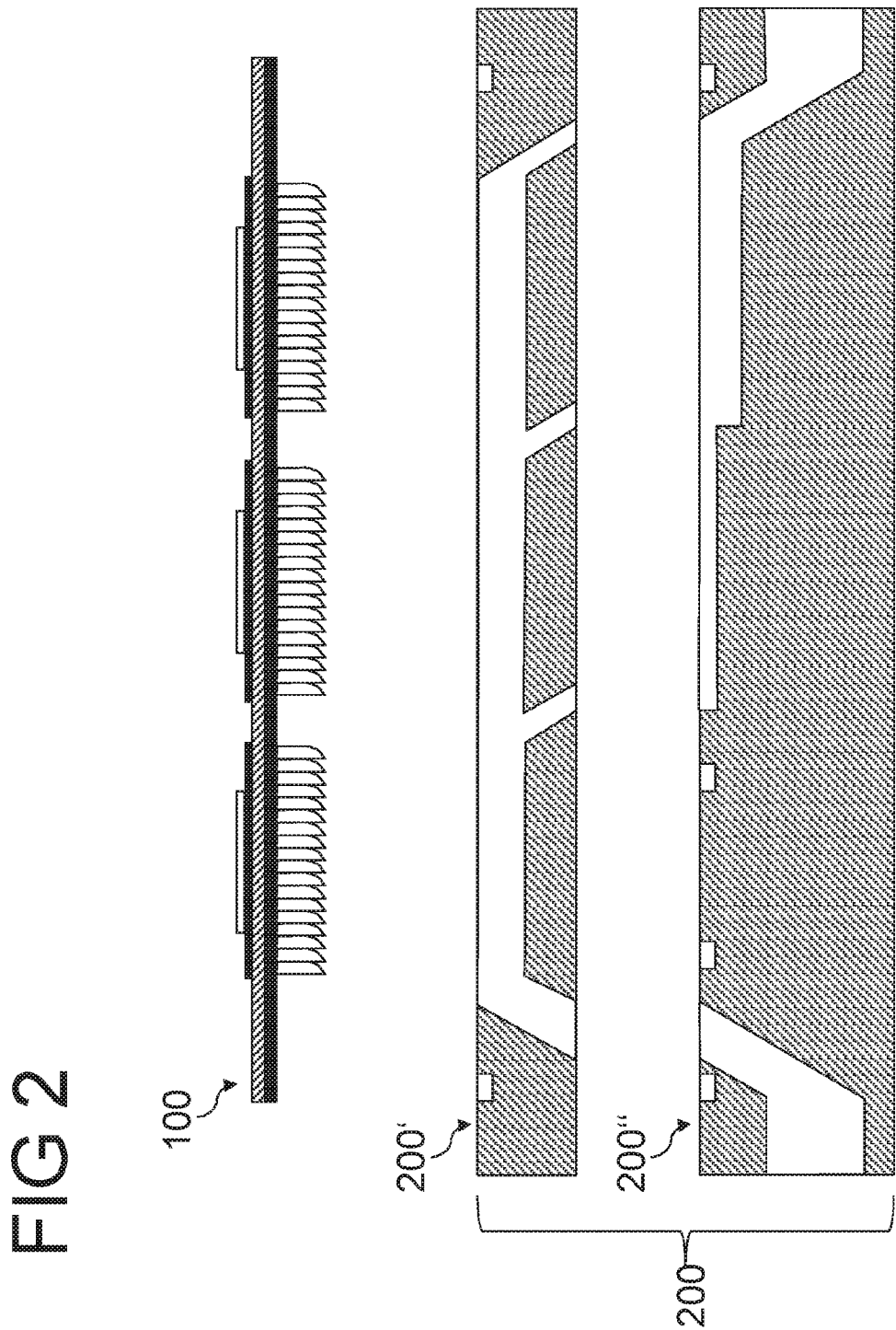

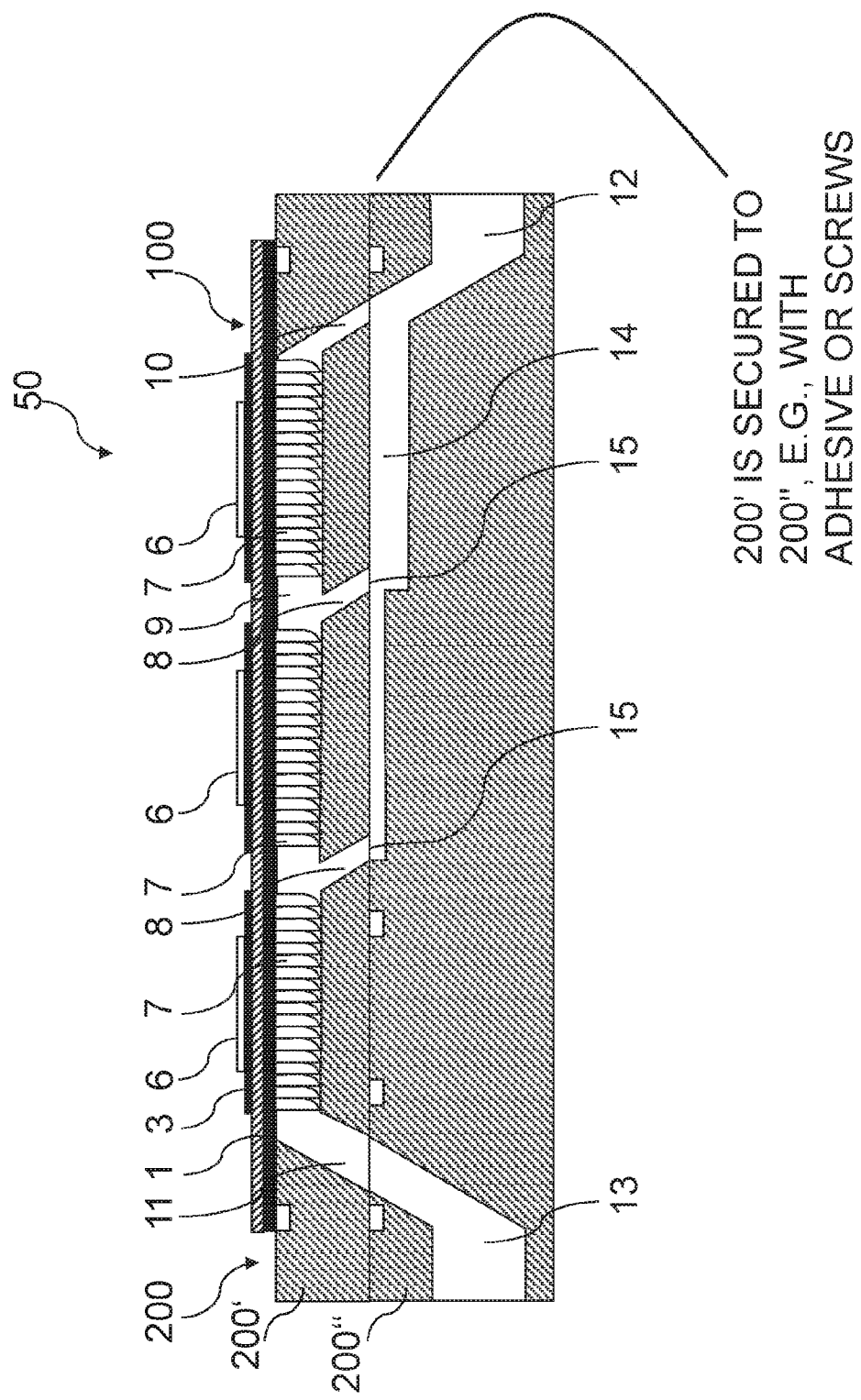

POWER SEMICONDUCTOR MODULE WITH LIQUID COOLING

PRIORITY CLAIM

This application claims priority to German Patent Application No. 10 2013 209 719.0, filed on 24 May 2013, the content of said German application incorporated herein by reference in its entirety.

TECHNICAL FIELD

The present application relates to the area of electronic cooling, in particular a power semiconductor module with liquid cooling.

BACKGROUND

When operating under high currents and voltages, semiconductor modules, and in particular power semiconductor modules, generate heat, which reduces the performance and lifetime of those modules if it is not removed appropriately. In the case of power semiconductor components and modules, with correspondingly high power losses, liquid cooling is used to ensure that the heat is transported away adequately.

In the case of direct liquid cooling, the power semiconductor module has on its underside heat exchangers (for example heat sinks), which take up the heat of the components and, by direct contact with the cooling liquid, transfer it to the liquid. Consequently, the cooling liquid heats up while it flows along the underside of the module, the temperature of the cooling liquid increasingly becoming closer to the operating temperature of the module. However, the cooling effect (i.e. the heat transfer from the module to the cooling liquid) is strongly dependent on the temperature difference between the component and the cooling liquid, and consequently the module is cooled better on that side on which the (cold) cooling liquid flows in than on that side on which the (heated) cooling liquid flows out again. The components that are arranged one behind the other in the module (seen in the direction of flow of the cooling liquid) are accordingly not cooled uniformly, and therefore experience different thermal loading, which restricts the lifetime of the module as a whole to the lifetime of the component that is cooled the worst.

Previous cooling solutions have only provided longitudinal and transverse flows of the cooling liquid underneath the baseplate, longitudinal flows running along the (long) longitudinal direction and transverse flows running along the (short) transverse direction of the module. In the case of the longitudinal flow, the effect of the inhomogeneity of the temperature distribution in the cooling liquid is at a maximum, since the cooling liquid is introduced on a narrow side of the module and is carried away again on the opposite side of the module. Over the entire length (i.e. along the longitudinal sides) of the module, the cooling liquid accordingly heats up, whereby the components that are located on each side of the module on which the heated cooling liquid is carried away are cooled with warmer liquid than those on the opposite side of the module, on which the cold cooling liquid is introduced.

The solution using transverse flow solves the problem of inhomogeneity, but requires much greater volumetric flows of the cooling liquid, since the flow cross section is dictated by the (long) longitudinal side. The associated higher pumping rates are unwanted, especially in modern areas of application such as electric or hybrid vehicles.

SUMMARY

Embodiments described herein provide a cooling device for a power semiconductor module with which it is ensured that the heat is uniformly transported away from the module even with moderate volumetric flows.

A power semiconductor module according to a first exemplary embodiment comprises a baseplate, at least one substrate to be cooled that has been applied to the baseplate and a two-part cooling system, arranged under the baseplate. This cooling system has an upper piece and a lower piece. The upper piece is designed in such a way that it forms with the baseplate a flow channel for a cooling liquid, the upper piece having a first inflow and also an outflow, through which the cooling liquid can be introduced into the flow channel and removed. Moreover, the upper piece has at least one second inflow, which is spaced apart from the first inflow in the longitudinal direction. The lower piece is configured with an inlet and an outlet, the outlet being connected to the outflow and the inlet being connected to the first inflow. Moreover, the lower piece has a channel branching off from the inlet, which includes at least one bypass channel, which is connected to the second inflow, and so part of the cooling liquid passes through the bypass channel into the flow channel.

A power semiconductor module according to a further exemplary embodiment comprises a substrate to be cooled and a two-part cooling system, arranged under the substrate. This cooling system has an upper piece and a lower piece. The upper piece is designed in such a way that it forms with the substrate a flow channel for a cooling liquid, the upper piece having a first inflow and also an outflow, through which the cooling liquid can be introduced into the flow channel and removed. Moreover, the upper piece has at least one second inflow, which is spaced apart from the first inflow in the longitudinal direction. The lower piece is configured with an inlet and an outlet, the outlet being connected to the outflow and the inlet being connected to the first inflow. Moreover, the lower piece has a channel branching off from the inlet, which includes at least one bypass channel, which is connected to the second inflow, and so part of the cooling liquid passes through the bypass channel into the flow channel. The two-part cooling system may be produced from a single part, in some embodiments.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a power semiconductor module in plan view, the module being made up of three substrates each with eight power semiconductors, a baseplate and also a cooling system.

FIG. 2 illustrates a horizontal longitudinal sectional view of a power semiconductor module according to FIG. 1, the possible routes of the channels in the cooling system being indicated.

FIG. 3 corresponds to the representation from FIG. 2, but the module and the cooling system are shown assembled.

DETAILED DESCRIPTION

In the following more detailed description, reference is made to the accompanying figures, in which specific exemplary embodiments are shown for purposes of illustration. It goes without saying that, unless otherwise specified, the features of the various exemplary embodiments described herein may be combined with one another.

FIG. 1 shows a power semiconductor module 50 in plan view from above, comprising of a baseplate 1, a cooling system 2 arranged thereunder and also substrates 3, which have been applied to the baseplate 1 and on which there may be power semiconductor components 6. The power semiconductor module 50 is normally rectangular, and consequently has a longer side (referred to hereinafter as the longitudinal side) and a shorter side (referred to hereinafter as the transverse side). Indications of direction are correspondingly given as the longitudinal direction and transverse direction. The geometrical shape of the semiconductor module may also be square. In this case, the longitudinal side and the transverse side would be of the same length. To facilitate the description, here, however, a non-square embodiment is described as an example.

Unlike as shown in the example from FIG. 1, a substrate 3 may itself assume the function of the baseplates. In this case, reference is often also made to "baseplateless" modules. For the purposes of the present description, the "baseplate" is either a separate baseplate of the module (usually of metal), on which one or more substrates (usually of ceramic, for example a DCB—Direct Copper Bonded—substrate) can be arranged, or the (for example ceramic) substrate itself, on which the semiconductor components are then arranged directly. The baseplate 1 may preferably have clearances in the regions between the substrates 3, where no cooling is necessary. These clearances allow material to be saved and the pressure loss in the cooling structures to be lowered. Generally, the clearances are not necessary for the functioning of the cooling system 2, and therefore represent an optional configuration.

The cooling system 2 is only schematically indicated in FIG. 1, in order to illustrate its positioning.

FIG. 2 shows a horizontal sectional view in the longitudinal direction of the power semiconductor module 50. The complete module substantially comprises three main components. Together with the cooling ribs 7 arranged underneath the regions of the baseplate 1 to be cooled, a baseplate 1, a substrate 3 and the power semiconductor components 6 arranged on it form the module 100 to be cooled. The embodiment of the module 100 to be cooled in FIGS. 2 and 3 shows a baseplate 1 of a composite form, which comprises two different layers. The upper layer (top layer) consists in this case of copper (Cu), the lower layer consists of aluminum (Al). Generally, however, the baseplate 1 may also be produced from solid material (for example Al, AlSiC or Cu). Production processes for producing such baseplates are, for example, cold extrusion or metal injection molding (MIM). Arranged on the underside of the module 100 to be cooled is the cooling system 200, which substantially comprises two components.

The cooling system 200 therefore comprises two parts. The upper piece 200', which is connected directly to the underside of the module 100, and also the lower piece 200", which lies against the upper piece 200'. The upper piece 200' has in this case an upper side which contains a well-like opening, which is configured in such a way that it forms with the module 100 to be cooled a flow channel 9 for the cooling medium. In this case, the opening is configured in a way that the cooling structures (cooling ribs 7) are completely accommodated in the flow channel 9.

The upper piece 200' also has an inflow 10 and an outflow 11 to and from the flow channel 9, which, from the lower side of the piece 200', connect the well-like opening of the upper side to the lower side. Consequently, cooling liquid can be introduced through the inflow 10 from the underside of the piece 200' into the flow channel 9 and flow away again on the other side in the longitudinal direction through the outflow 11. Apart from the inflow 10 and the outflow 11, the upper piece 200' has at least one further inflow 8, which is spaced apart from the inflow 10 and the outflow 11 in the longitudinal direction (in the direction of flow), and consequently is thus located between the inflow 10 and the outflow 11 in the longitudinal direction. In this case, the exact position of the further inflow 8 is chosen such that it is located between two cooling structures (cooling ribs 7) in the longitudinal direction. In the present example, two further inflows 8 are provided in addition to the inflow 10. Via these inflows 8 and 10, "fresh" (i.e. cold) cooling medium can be introduced at different points in the direction of flow (longitudinal direction) of the well-like opening. The individual inflows 8, 10 are in this case arranged in such a way that fresh cooling medium can flow directly onto those regions of the baseplate 1 that are located directly under a heat source (for example DCB substrate 3 with power semiconductor components 6, see FIG. 1). Directly flowed onto means in this connection that the cooling medium reaches the regions to be cooled of the baseplate 1 underneath a heat source without previously having been preheated appreciably by neighboring heat sources. An additional advantage of the bypass cooling system is the much lower pressure drop in comparison with a standard cooling system, on account of the lower volumetric flow through the flow channel 9.

The lower piece 200" also has an inlet 12 and an outlet 13, which connect the supply line and removal line of the cooling liquid to the upper side of the lower piece 200". In this case, the inlet 12 and the outlet 13 are configured in such a way that, when the lower piece 200" is attached to the upper piece 200' (for example by adhesive bonding or screwing), the inlet 12 is connected to the inflow 10 and the outflow 11 is connected to the outlet 13, and so cooling liquid can flow from the inlet 12 through the inflow 10 into the flow channel 9 and can subsequently flow away out from the outlet 13 through the outflow 11.

Moreover, the lower piece 200" has a channel 14 branching off from the inlet, which has at least one bypass channel 15, which is connected to the further inflow 8 of the upper piece 200', and so part of the cooling liquid flows parallel to the flow channel 9 in the branching channel 14, until it passes through the bypass channel 15 into the flow channel 9. In this way, fresh (i.e. cold and not yet preheated) cooling water is injected into the flow channel 9 at a position closer to the outlet in the longitudinal direction than the inlet, which provides more effective cooling of the cooling structure (cooling ribs 7) located there in comparison with injection into the flow channel 9 via the inflow 10 alone. The representation in FIG. 3 corresponds to the representation from FIG. 2, in FIG. 3 the power semiconductor module and the cooling system being shown assembled.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
    a baseplate;
    a substrate arranged on the baseplate; and
    a two-part cooling system arranged under the baseplate and comprising:
        an upper piece connected directly to the baseplate and comprising an opening configured so as to form, with the baseplate, a flow channel for a cooling liquid, the upper piece having a first inflow and an outflow through which the cooling liquid can be introduced into the flow channel and removed, the upper piece further having at least one second inflow spaced apart from the first inflow in a longitudinal direction; and
        a lower piece attached to the upper piece by adhesive bonding or screws and having an inlet and an outlet, the outlet being connected to the outflow of the upper piece and the inlet being connected to the first inflow of the upper piece, the lower piece further having a channel branching off from the inlet, which has at least one bypass channel, which is connected to the second inflow, so part of the cooling liquid passes through the bypass channel into the flow channel.

2. The power semiconductor module of claim 1, wherein the direction of flow of the cooling liquid runs from the inlet to the outlet in the longitudinal direction of the module.

3. The power semiconductor module of claim 1, wherein at least one power semiconductor to be cooled is applied to the substrate.

4. The power semiconductor module of claim 1, wherein cooling ribs underneath the baseplate protrude into the channel at points to be cooled and are immersed in the cooling liquid.

5. The power semiconductor module of claim 1, wherein the baseplate comprises ceramic or metal.

6. The power semiconductor module of claim 1, wherein the upper piece has a third inflow spaced further apart than the second inflow from the first inflow, and wherein the lower piece has a first bypass channel portion arranged so that it extends between the first inflow and the second inflow, and a second bypass channel portion arranged so that it extends between the second inflow and the third inflow, wherein the second bypass channel portion has a smaller channel size, in at least one dimension transverse to the longitudinal direction, than the first bypass channel portion.

7. A power semiconductor module, comprising:
    a substrate to be cooled; and
    a two-part cooling system arranged under the substrate and comprising:
        an upper piece connected directly to the substrate and comprising an opening configured so as to form, with the substrate, a flow channel for a cooling liquid, the upper piece having a first inflow and an outflow through which the cooling liquid can be introduced into the flow channel and removed, the upper piece further having at least one second inflow spaced apart from the first inflow in a longitudinal direction; and
        a lower piece attached to the upper piece by adhesive bonding or screws and having an inlet and an outlet, the outlet being connected to the outflow of the upper piece and the inlet being connected to the first inflow of the upper piece, the lower piece further having a channel branching off from the inlet, which has at least one bypass channel, which is connected to the second inflow, so part of the cooling liquid passes through the bypass channel into the flow channel.

8. The power semiconductor module of claim 7, wherein the substrate comprises a ceramic.

9. The power semiconductor module of claim 7, wherein the substrate is a-direct copper bonded (DCB) substrate.

10. The power semiconductor module of claim 7, wherein the upper piece has a third inflow spaced further apart than the second inflow from the first inflow, and wherein the lower piece has a first bypass channel portion arranged so that it extends between the first inflow and the second inflow, and a second bypass channel portion arranged so that it extends between the second inflow and the third inflow, wherein the second bypass channel portion has a smaller channel size, in at least one dimension transverse to the longitudinal direction, than the first bypass channel portion.

11. A method of assembling a power semiconductor module, the method comprising:
    arranging a substrate on a baseplate; and
    arranging a two-part cooling system having an upper piece and a lower piece under the baseplate, by attaching the upper piece to the lower piece by adhesive bonding or screws, so that:
        the upper piece is connected directly to the baseplate and comprises an opening configured so as to form, with the baseplate a flow channel for a cooling liquid, the upper piece having a first inflow and an outflow through which the cooling liquid can be introduced into the flow channel and removed, the upper piece further having at least one second inflow spaced apart from the first inflow in a longitudinal direction; and
        an outlet of the lower piece is connected to the outflow of the upper piece and an inlet of the lower piece is connected to the first inflow of the upper piece, the lower piece having a channel branching off from the inlet, which has at least one bypass channel, which is connected to the second inflow, so part of the cooling liquid passes through the bypass channel into the flow channel.

12. The method of claim 11, wherein the upper piece has a third inflow spaced further apart than the second inflow from the first inflow, and wherein said arranging comprises arranging the lower piece so that it has a first bypass channel portion arranged so that it extends between the first inflow and the second inflow, and a second bypass channel portion arranged so that it extends between the second inflow and the third inflow, wherein the second bypass channel portion has a smaller channel size, in at least one dimension transverse to the longitudinal direction, than the first bypass channel portion.

* * * * *

UNITED STATES PATENT AND TRADEMARK OFFICE
CERTIFICATE OF CORRECTION

PATENT NO.       : 9,578,789 B2
APPLICATION NO.  : 14/282556
DATED            : February 21, 2017
INVENTOR(S)      : A. Uhlemann et al.

Page 1 of 1

It is certified that error appears in the above-identified patent and that said Letters Patent is hereby corrected as shown below:

In the Claims

Column 6, Line 25 (Claim 9, Line 2) please change "is a-direct" to -- is a direct --

Signed and Sealed this
Sixth Day of June, 2017

Michelle K. Lee
*Director of the United States Patent and Trademark Office*